(12) United States Patent
De Jager (10) Patent No.: US 7,142,286 B2
(45) Date of Patent: Nov. 28, 2006

(54) LITHOGRAPHIC APPARATUS AND DEVICE MANUFACTURING METHOD

(75) Inventor: Pieter Willem Herman De Jager, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 197 days.

(21) Appl. No.: 10/899,302

(22) Filed: Jul. 27, 2004

(65) Prior Publication Data

US 2006/0023190 A1 Feb. 2, 2006

(51) Int. Cl.
G03B 27/72 (2006.01)
G03B 27/42 (2006.01)
G03B 27/54 (2006.01)
G03B 27/32 (2006.01)
G03B 26/08 (2006.01)

(52) U.S. Cl. ............... 355/71; 355/53; 355/67; 355/77; 359/224; 359/291

(58) Field of Classification Search ............ 355/53, 355/71, 77, 67; 359/224, 291, 619
See application file for complete search history.

(56) References Cited

U.S. PATENT DOCUMENTS

| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,473,237 B1* | 10/2002 | Mei ............... 359/619 |
| 6,687,041 B1 | 2/2004 | Sandstrom |
| 6,747,783 B1 | 6/2004 | Sandstrom |
| 6,795,169 B1 | 9/2004 | Tanaka et al. |

(Continued)

FOREIGN PATENT DOCUMENTS

EP 1 482 375 A2 12/2004

(Continued)

*Primary Examiner*—Alan Mathews
(74) *Attorney, Agent, or Firm*—Sterne, Kessler, Goldstein & Fox P.L.L.C.

(57) ABSTRACT

A lithographic apparatus and method include an illumination system that supplies a beam of radiation, an array of individually controllable elements that pattern the beam, and a projection system that directs the patterned beam a substrate supported on a substrate table. The projection system defines a pupil. Either the pupil or the array of individually controllable elements is imaged onto a target portion of the substrate. The projection system includes an array of lenses with each lens in the array arranged to direct a respective part of the patterned beam onto a respective part of the target portion of the substrate. In one example, each of the individually controllable elements is selectively controllable to direct a respective part of the beam away from the pupil such that the proportion of the bean passing through the pupil is adjusted. In one example, the individually controllable elements are arranged in groups, such that radiation deflected by each element in one group is directed towards the same lens in the lens array. In one example, the individually controllable elements in any one group are controlled together to direct radiation in different directions away from the pupil, such that the pattern imparted to the beam by that group of elements is substantially symmetrical with respect to the pupil.

17 Claims, 4 Drawing Sheets

U.S. PATENT DOCUMENTS

| | | |
|---|---|---|
| 6,806,897 B1 | 10/2004 | Kataoka et al. |
| 6,811,953 B1 | 11/2004 | Hatada et al. |
| 2004/0041104 A1 | 3/2004 | Liebregts et al. |
| 2004/0075882 A1* | 4/2004 | Meisburger ................. 359/290 |
| 2004/0130561 A1 | 7/2004 | Jain |

FOREIGN PATENT DOCUMENTS

| | | |
|---|---|---|
| WO | WO 98/3396 | 7/1998 |
| WO | WO 98/38597 | 9/1998 |

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

The conventional lithographic apparatus delivers a beam to the substrate through a lens assembly in which each of the lenses is arranged in series along the beam projection direction. The lens component closest to the substrate is a single lens through which all of the beam passes.

An alternative design approach uses a series of lenses arranged along the beam path, but the lens component closest to the substrate is in the form of a two dimensional array of small lenses. Each of the small lenses focuses a respective part of the beam onto a respective part of the substrate. Lithography systems using this design are generally referred to as microlens array imaging systems or MLA systems.

In the lithographic apparatus incorporating the MLA systems, it is possible to rely upon an array of individually controllable elements that provide a black or white effect. An individual element either reflects a beam directly towards an individual lens of the MLA ("white") or directs light away from the lens of the MLA array ("black"). The effect is the same as turning ON or turning OFF a beam component directed towards that single lens, which delivers either a maximum intensity beam or a zero intensity beam.

It is desirable have a gray-tone capability, which is the capability of delivering to the substrate a light intensity intermediate a maximum and a zero intensity. A gray-tone capability is desirable in lithographic apparatus relying upon MLA arrays. It has been proposed to provide gray-tone capability by progressively adjusting the position of individual mirrors in a mirror array to progressively reflect light away from the center of a respective lens in the lens array. A single beam of light from a single mirror of a mirror array is progressively displaced relative to a respective lens of the lens array.

In a lithographic apparatus in which a single mirror is used to reflect light to a single lens of the array and that mirror is progressively displaced to direct the reflected beam progressively away from that single lens, not only the intensity of the beam reaching the substrate is modulated. For example, in MLA systems in which the pupil of the projection optics is imaged on the substrate, the pupil is asymmetrical with respect to the beam of light which illuminates a single lens of the array. Thus, both the intensity and position of the spot of illumination at the substrate are modulated as a result of deflection of the mirror element. In MLA systems in which the displaceable mirror elements are imaged on the substrate, the beam reaching the substrate from an individual mirror will not be telecentric, The non-telecentricity will vary with displacement of the mirror, resulting in the position of the spot of illumination at the substrate varying with focus.

Therefore, what is needed is an improved lithographic apparatus and device manufacturing method that can be used in a microlens array imaging system to provide gray-tone capability.

SUMMARY OF THE INVENTION

According to an embodiment of the present invention, there is provided a lithographic apparatus comprising an illumination system for supplying a beam of radiation, an array of individually controllable elements serving to impart to the beam a pattern in its cross-section, a substrate table for supporting a substrate, and a projection system for projecting the patterned beam onto a target portion of the substrate. The projection system defines a pupil and comprises an array of lenses. Each lens in the array is arranged to direct a respective part of the patterned beam towards a respective part of the target portion of the substrate.

In one example, each of the individually controllable elements is selectively controllable to progressively direct a respective part of the beam away from the pupil, such that the proportion of the beam passing through the pupil is progressively adjusted.

In one example, the individually controllable elements are arranged in groups, such that radiation is directed by each element in one group towards the same lens in the lens array. The individually controllable elements in any one group are controlled together to progressively direct radiation in different directions away from the pupil, such that the pattern imparted to the beam by that group of elements is substantially symmetrical with respect to the pupil.

In one example, two or more mirrors, or other progressively adjustable pattern imparting devices, are used to illuminate a single lens of the array and those mirrors, or other pattern imparting devices, are controlled to create a symmetrical arrangement in which the illumination spot position is decoupled from the illumination spot intensity.

In one example, two individually controllable elements, such as mirror elements, may make up a single group. Each of the two elements are progressively adjusted, so as to direct radiation away from the pupil in directions inclined at 180° to each other.

In one example, three elements progressively direct radiation away from the pupil in directions inclined at 120° intervals to each other.

In one example, four elements progressively direct radiation away from the pupil in directions inclined at 90° intervals to each other.

In these above examples, the individually controllable elements can be mirrors, each of which can be tilted progressively away from a position in which radiation reflected by that mirror is symmetrical with respect to the pupil. A beam splitter can be used to reflect radiation from the illumination system to the individual controllable element and to transmit light from the individually controllable element towards the array of lenses. The pupil can be defined by a projection lens contrast aperture plate.

Another embodiment of the present invention provides a device manufacturing method comprising the steps of providing a substrate, providing a beam of radiation using an illumination system, using an array of individually controllable elements to impart to the beam a pattern in its cross section, projecting the patterned beam of radiation onto a target portion of the substrate through an array of lenses each of which is arranged to direct a respective part of the patterned beam towards a respective part of the target portion, and selectively controlling each of the individually controllable elements progressively to direct a respective part of the beam away from the pupil such that the proportion of the beam passing through the pupil is progressively adjusted. The individually controllable elements are controlled in groups, such that the elements in any one group direct radiation towards the same lens in the lens array and are controlled progressively to direct radiation away from the pupil in different directions such that the pattern imparted to the beam by that group of elements is substantially symmetrical with respect to the pupil.

In one example, the present invention described in the embodiments and examples above is used in a lithographic apparatus relying upon arrays of individually controllable elements to impart a pattern to the projected beam.

Further embodiments, features, and advantages of the present inventions, as well as the structure and operation of the various embodiments of the present invention, are described in detail below with reference to the accompanying drawings.

BRIEF DESCRIPTION OF THE
DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE
EMBODIMENTS

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
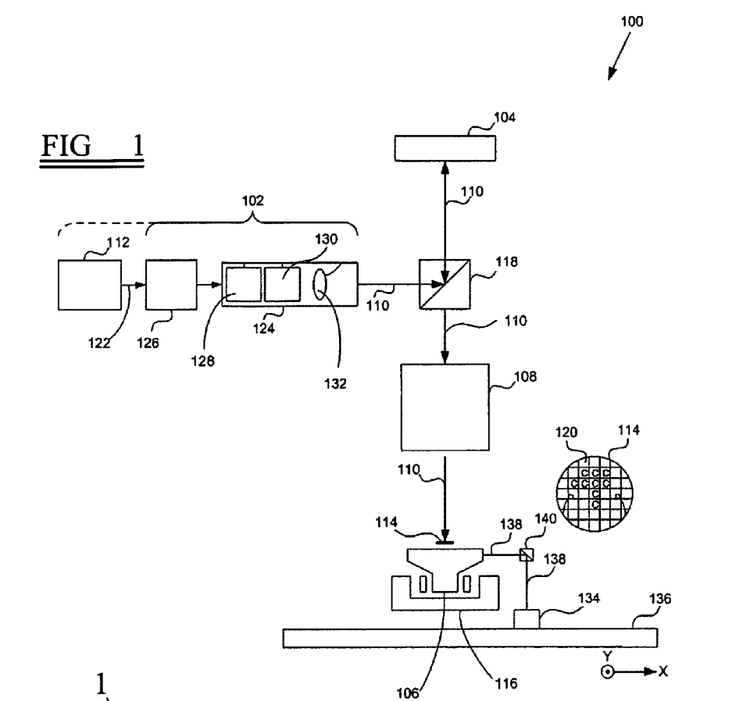
FIG. 1 depicts features of a lithographic apparatus of a type to which one or more embodiments of the present invention may be applied.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

Exemplary

Figure 2:
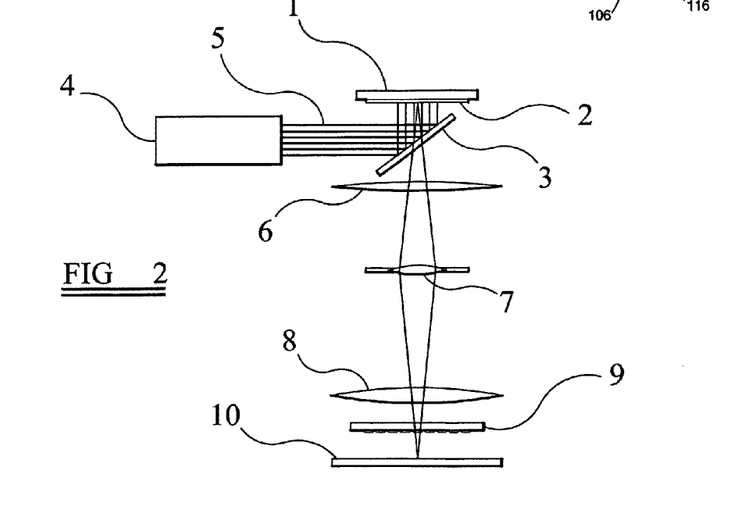
FIG. 2 is a simplified illustration of an optical projection system incorporating a microlens array, according to one embodiment of the present invention.

FIG. 2 is a simplified illustration of an optical projection system incorporating a microlens array, according to one embodiment of the present invention. FIG. 2 illustrates in schematic form a particular lithographic apparatus of the type described in general terms in FIG. 1. The apparatus shown in FIG. 2 comprises a contrast device 1 having a two dimensional array of elements 2 on a lower surface thereof. An angular position of each of the two dimensional array of elements 2 can be selectively controlled. A beam splitter 3 is positioned beneath contrast device 1. An illumination source 4 directs a beam of radiation 5 towards beam splitter 3, which reflects beam 5 onto the lower surface of contrast device 1.

One of the elements 2 of contrast device 1 reflects a component part of beam 5 back through beam splitter 3 and through projection optics defined by lenses 6, 7, and 8 onto substrate 10. In one example, a lowermost lens 8 is a field lens that produces a substantially telecentric beam, which is directed towards a microlens array 9. Microlens array 9 comprises a two dimensional array of small lenses, each of which is arranged so as to focus light incident upon it onto an upper surface of substrate 10. Thus, for each of contrast elements 2 in contrast device 1 that acts as a mirror reflecting light to array 9, a respective one of the lenses in array 9 is illuminated and a respective spot of light is projected by that lens in array 9 onto the upper surface of substrate 10. In this arrangement, contrast device 1 is imaged on substrate 10.

Figure 3:
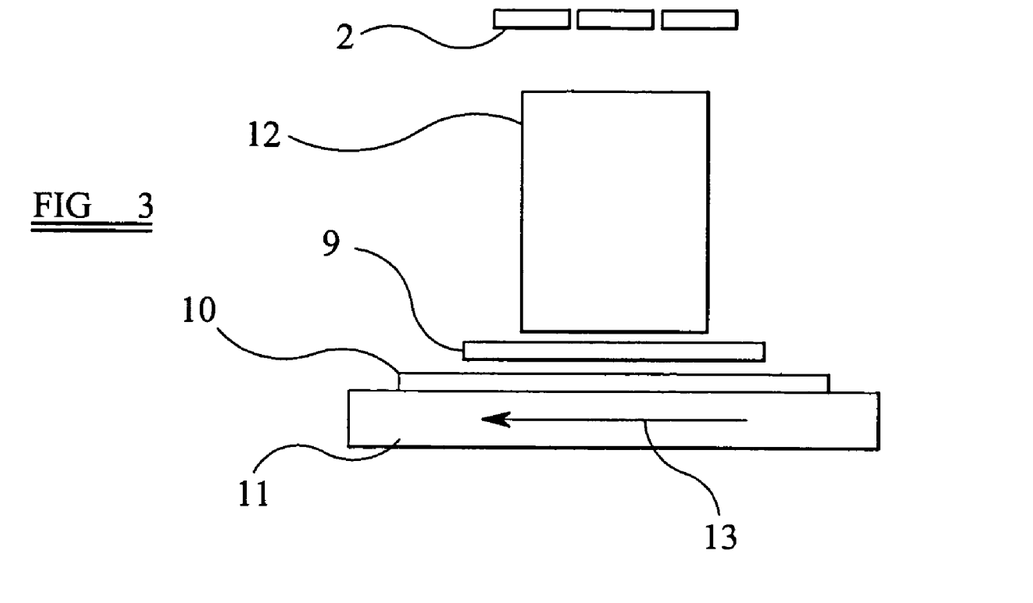
FIG. 3 is a simplified illustration of components of the system shown in FIG. 2 and includes a displaceable substrate table, according to one embodiment of the present invention.

FIG. 3 is a simplified illustration of components of the system shown in FIG. 2 and includes a displaceable substrate table, according to one embodiment of the present invention. In this example, substrate 10 is shown supported on a substrate table 11 beneath microlens array 9. The projection optics are represented by a simple rectangle 12. Three contrast elements 2 of contrast device 1 of FIG. 2 are shown above projection optics 12. In this example, substrate table 11 is moved in a linear manner in a direction of arrow 13 beneath microlens array 9.

Figure 4:
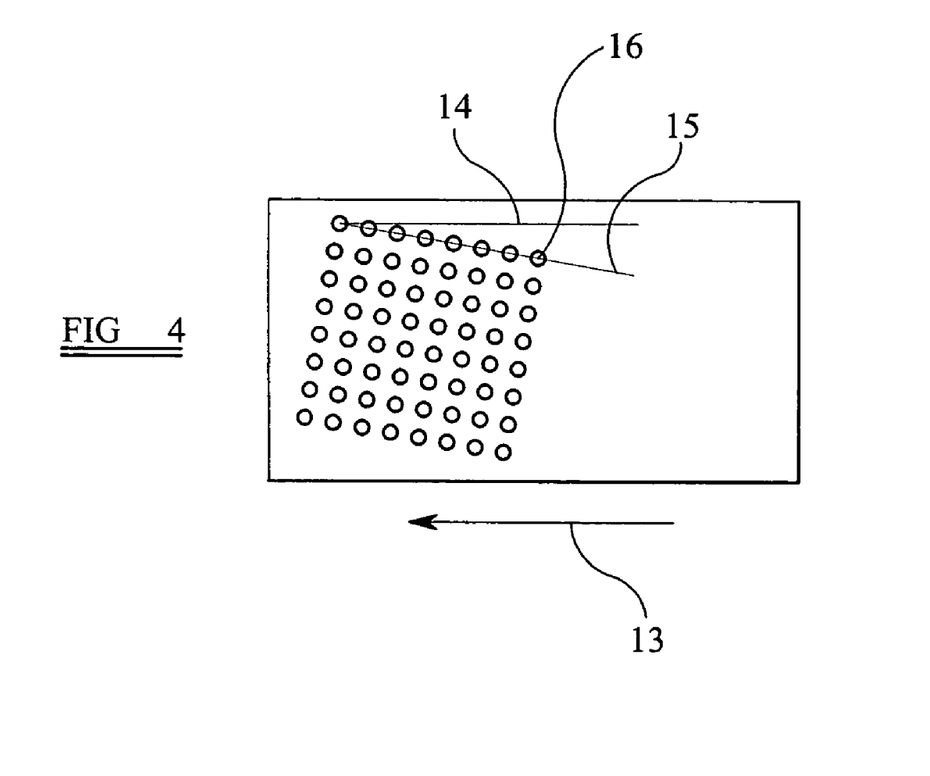
FIG. 4 is a schematic representation of the orientation of spots of light projected onto a substrate in the system illustrated in FIG. 3, according to one embodiment of the present invention.

FIG. 4 is a schematic representation of the orientation of spots of light projected onto a substrate in the system illustrated in FIG. 3, according to one embodiment of the present invention. This figure is illustrative of a relationship between a disposition of the individual lenses in microlens array 9 of FIGS. 2 and 3 and a direction of displacement of substrate table 11 of FIG. 3. The direction of displacement is represented in FIG. 4 by arrow 13. That direction is parallel to a line 14 that is inclined with respect to a line 15. Line 15 extends parallel to a row of the lenses in microlens array 9. Each lens projects light onto a different one of a rectangular array of spots 16. The lenses are arranged in a two dimensional array that is slightly inclined with respect to direction 13 of substrate table movement, such that the entire surface of substrate 10 can be exposed by appropriate control of the illumination beams delivered to the respective lenses by the respective elements 2 of contrast device 1. Each lens can in effect "write" a continuous line on the surface of substrate 10 and, given the disposition of the lenses relative to the direction of substrate movement, those lines are sufficiently close together to overlap. In order to expose a selected two dimensional area of substrate 10, substrate 10 is advanced beneath microlens array 9. The individual lenses beneath which the area to be exposed is positioned at any one time are illuminated by appropriate control of the associated elements 2 of contrast device 1.

Figure 5:
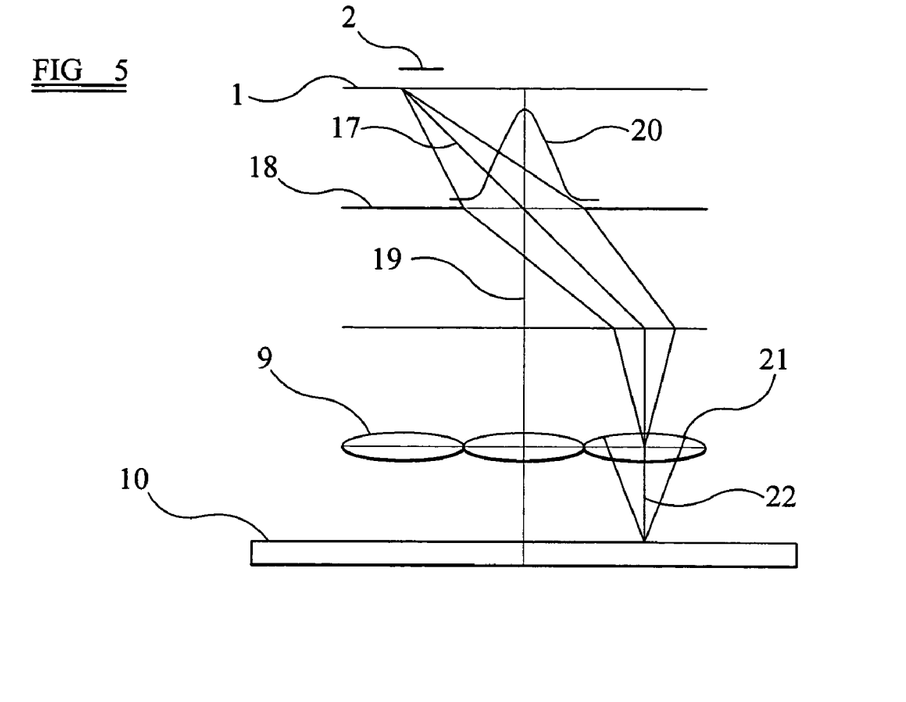
FIG. 5 is a schematic representation of a contrast device and contrast aperture in a first disposition of the contrast device, according to one embodiment of the present invention.
Figure 6:
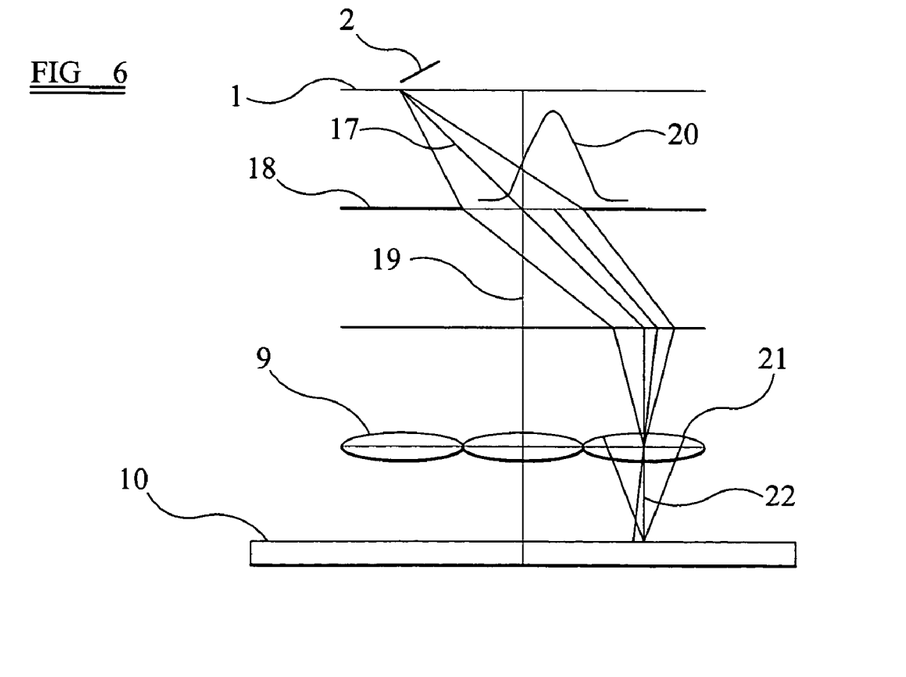
FIG. 6 corresponds to FIG. 5 after a change in the disposition of the contrast device, according to one embodiment of the present invention.

FIG. 5 is a schematic representation of a contrast device and contrast aperture in a first disposition of the contrast device, according to one embodiment of the present invention. FIG. 6 corresponds to FIG. 5 after a change in the disposition of the contrast device, according to one embodiment of the present invention.

In one example, it is desirable to be able to control the intensity of radiation reaching each of spots 16 on substrate 10. In this example, the position of individual reflective elements 2 of the contrast device 1 are adjusted, for example as shown in FIGS. 2 and 3. This can be done so that only part of a beam of light reflected by an individual reflective element 2 reaches the associated lens in microlens array 9. This is illustrated schematically in FIGS. 5 and 6.

FIG. 5 shows a reflective element 2 of a contrast device 1 directing a beam of radiation along an axis 17 directed at a center of a circular aperture in a contrast aperture plate 18.

FIG. 6 shows element 2 after it has been tilted relative to its position in FIG. 5, so that the beam is partially offset relative to contrast aperture plate 18. In the arrangement of FIGS. 5 and 6, contrast aperture plate 18 defines a pupil that is imaged at substrate 10.

In one example, as illustrated in FIG. 5, the intensity of the radiation is symmetrical about a center line 19 passing through the center of contrast aperture plate 18. This intensity is represented by a curve 20. Thus, a beam passing through contrast aperture plate 18 that reaches a lens 21 of microlens array 9 is projected onto substrate 10 to form an illumination spot on substrate 10 that is symmetrical about a central axis of lens 21, which axis is represented by line 22.

In one example, as illustrated in FIG. 6, the intensity distribution represented by line 20 is offset relative to center line 19 of contrast aperture plate 18, so too is the distribution of light on substrate 10 beneath lens 21. As a result, there is an undesirable coupling between spot position and intensity on substrate 10. Effectively, a portion of the spot projected onto substrate 10 to the left of line 22 in FIG. 6 receives radiation of a greater intensity than a portion of the spot to the right of line 22. Thus, although displacing element 2 of contrast device 1 from the position shown in FIG. 5 to the position shown in FIG. 6 does reduce the intensity of the radiation reaching substrate 10, the symmetrical distribution of that radiation that is achieved in the case illustrated in FIG. 5 is not achieved in the case illustrated in FIG. 6.

Figures 7, 8, 9:
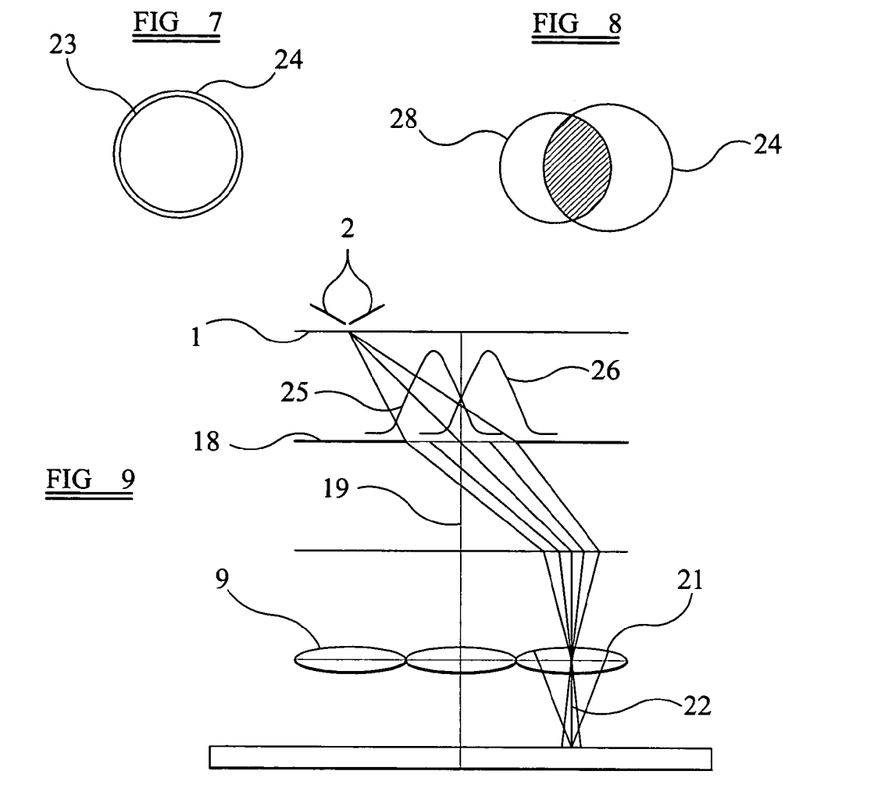
FIGS. 7 and 8 illustrate the distribution of a radiation beam relative to the contrast aperture given the dispositions of the contrast device shown in FIGS. 5 and 6, according to embodiments of the present invention.
FIG. 9 shows an arrangement in which two contrast devices are adjusted to produce a radiation distribution that is symmetrical relative to a contrast aperture, according to one embodiment of the present invention.

FIGS. 7 and 8 illustrate the distribution of a radiation beam relative to contrast aperture plate 18 given the dispositions of contrast device 1 shown in FIGS. 5 and 6, according to embodiments of the present invention.

FIG. 7 illustrates, through line 23, a periphery of the aperture in the contrast aperture plate 18 of FIG. 5 and, through line 24, the position relative to that aperture of the beam of radiation.

In contrast, FIG. 8 shows, through line 28, the relative disposition of periphery 28 of the aperture and of beam of radiation 24 in the case illustrated in FIG. 6. Beam 24 overlaps aperture 28 only in a shaded area, which is clearly asymmetrical.

FIG. 9 shows an arrangement in which two contrast devices are adjusted to produce a radiation distribution that is symmetrical relative to a contrast aperture, according to one embodiment of the present invention. Symmetry is achieved by relying upon two contrast devices 2 to illuminate a same lens 21 of microlens array 9. The distribution of the radiation reflected by the left hand element 2 in FIG. 9 is indicated by line 25 in FIG. 9, whereas the intensity distribution related to the right hand element 2 is indicated by line 26. These two distributions are symmetrical relative to a plane through center line 19 of the aperture in aperture plate 18. This symmetry is maintained throughout the projection system, such that there is symmetry about a plane perpendicular to FIG. 9 and through center line 22 of lens 21.

Figures 10, 11:
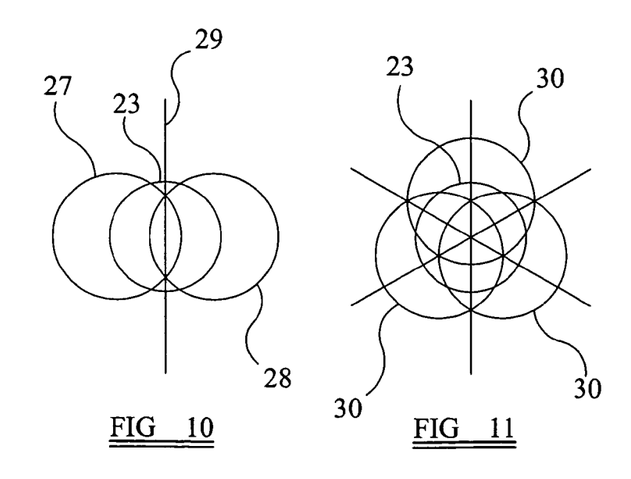
FIG. 10 illustrates a distribution of radiation given the dispositions of the two contrast devices shown in FIG. 9, according to one embodiment of the present invention.
FIGS. 11 and 12 illustrate distribution of radiation in an arrangement with three symmetrically disposed contrast devices and four symmetrically disposed contrast devices, respectively, according to various embodiments of the present invention.

FIG. 10 illustrates a distribution of radiation given the dispositions of the two contrast devices shown in FIG. 9, according to one embodiment of the present invention. Line 23 is the periphery of the aperture in aperture plate 18 and lines 27 and 28 are the periphery of the beams projected by respective elements 2 of contrast device 1 shown in FIG. 9.

Symmetry is maintained about a plane perpendicular to FIG. 9 indicated by line 29, which passes through line 22 in FIG. 9.

In the example illustrated in FIGS. 9 and 10, a group of two of reflective elements 2 reflect light towards the same single lens of microlens array 9. The two reflective elements 2 making up the group are controlled, such that they rotate in opposite directions. Thus, they deflect the associated beams of radiation in directions that are inclined to each other by 180°.

It is to be appreciated that a group could comprise more than two reflective elements 2 and still maintain the required symmetry. For example, three reflective elements 2 could be arranged in a group associated with one lens of microlens array 9.

Figure 12:
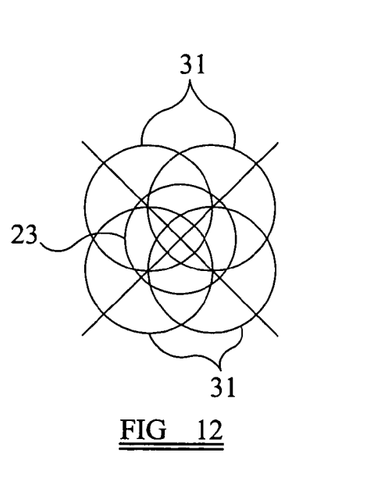

FIGS. 11 and 12 illustrate distribution of radiation in an arrangement with three symmetrically disposed contrast devices and four symmetrically disposed contrast devices, respectively, according to various embodiments of the present invention.

As schematically represented in FIG. 11, three reflective elements are arranged as a group to progressively deflect radiation in directions inclined at 120° intervals with respect to each other. The outline of the aperture in the aperture plate 18 is again represented by line 23, whereas the three separate beams deflected by the group of three associated reflective elements are represented by lines 30.

As schematically represented in FIG. 12, four individually controllable elements are arranged as a group to progressively deflect radiation in directions inclined at 90° intervals with respect to each other. The outline of the aperture in the aperture plate 18 is again represented by line 23, whereas the four beams reflected by the group of four associated reflective elements are indicated by lines 31.

In each of the cases illustrated in FIGS. 10, 11 and 12, symmetry is maintained relative to planes indicated by straight lines.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   an array of individually controllable elements that pattern the beam; and
   a projection system that projects the patterned beam onto a target portion of a substrate, the projection system defining a pupil and comprising an array of lenses,
   wherein the array of lenses is arranged to direct a respective part of the patterned beam towards a respective part of the target portion of the substrate,
   wherein the individually controllable elements are selectively controllable to progressively direct a respective part of the patterned beam away from the pupil, such that a amount of the patterned beam passing through the pupil is progressively varied,
   wherein the individually controllable elements are arranged in groups, such that the patterned beam is directed by each element in each group towards a same lens in the lens array, and
   wherein the individually controllable elements in each group are controlled together to direct the patterned beam in different directions away from the pupil, such that a pattern imparted onto the beam by that group of individually controllable elements is substantially symmetrical with respect to the pupil.

2. The apparatus of claim 1, wherein each of the groups of the individually controllable elements comprises two elements that progressively direct the patterned beam away from the pupil in directions inclined by 180° with respect to each other.

3. The apparatus of claim 1, wherein the groups of the individually controllable elements comprises three elements that progressively direct the patterned beam away from the pupil in directions inclined at 120° intervals with respect to each other.

4. The apparatus of claim 1, wherein the groups of the individually controllable elements comprises four elements that progressively direct radiation away from the pupil in directions inclined at 90° intervals with respect to each other.

5. The apparatus of claim 1, wherein the individually controllable elements are mirrors that are tilted progressively away from a position in which the beam reflected by that mirror is symmetrical with respect to the pupil.

6. The apparatus of claim 5, further comprising:
   a beam splitter that reflects the beam from the illumination system toward the individual controllable elements and transmits the patterned beam from the individually controllable elements towards the array of lenses.

7. The apparatus of claim 1, wherein the pupil is defined by a projection lens contrast aperture plate.

8. A device manufacturing method, comprising:
   patterning a beam using an array of individually controllable elements;
   projecting the patterned beam onto a target portion of a substrate using an array of lenses in a projection system, wherein the lens in the array of lenses is arranged to direct a respective part of the patterned beam towards a respective part of the target portion;
   selectively controlling the individually controllable elements to progressively direct a respective part of the patterned beam away from a pupil in the projection system, such that an amount of the patterned beam passing through the pupil is progressively varied; and
   controlling the individually controllable elements in groups,
   wherein the individually controllable elements in each group direct the patterned beam towards a same lens in the array of lenses,
   wherein the individually controllable elements in each group progressively direct radiation away from the pupil in different directions, such that the pattern imparted to the beam by each of the groups is substantially symmetrical with respect to the pupil.

9. The method of claim 8, further comprising:
   forming one of the groups with two of the individually controllable elements, which are progressively adjusted to direct the patterned beam away from the pupil in directions inclined by 180° with respect to each other.

10. The method of claim 8, further comprising:
    forming one of the groups with three of the individually controllable elements, which are progressively adjusted to direct the patterned beam away from the pupil in directions inclined by 120° with respect to each other.

11. The method of claim 8, further comprising:

forming one of the groups with four of the individually controllable elements, which are progressively adjusted to direct the patterned beam away from the pupil in directions inclined by 90° with respect to each other.

12. The method of claim 8, further comprising:

using mirrors as the individually controllable elements, wherein the mirrors are tilted away from a position in which the patterned beam deflected by each of the mirrors is symmetrical with respect to the pupil.

13. The method of claim 12, further comprising:

directing the beam towards the individual controllable elements using a beam splitter; and directing the patterned beam from the individually controllable elements towards the array of lenses via the beam splitter.

14. The method of claim 8, wherein a projection lens contrast aperture is positioned to define the pupil.

15. A lithographic apparatus, comprising:

an illumination system that supplies a beam of radiation;

an array of individually controllable elements that pattern the beam; and a projection system that projects the patterned beam onto a target portion of a substrate, the projection system defining a pupil and comprising an array of lenses, which are arranged to direct a respective part of the patterned beam towards a respective part of the target portion, wherein the individually controllable elements are arranged in groups, such that the patterned beam is directed by each element in each respective group towards a same respective lens in the lens array, and wherein each of the individually controllable elements is selectively controllable to direct a respective part of the patterned beam away from the pupil, such that an amount of the patterned beam passing through the pupil is varied.

16. A device manufacturing method, comprising:

patterning a beam using an array of individually controllable elements;

projecting the patterned beam onto a target portion of a substrate using an array of lenses in a projection system, wherein lenses in the array of lenses are arranged to direct a respective part of the patterned beam towards a respective part of the target portion; and controlling the individually controllable elements in groups, wherein the individually controllable elements in the groups direct the patterned beam towards a same lens in the array of lenses, wherein the individually controllable elements in the groups direct radiation away from a pupil of the projection system in different directions, such that the pattern imparted to the beam by the groups is substantially symmetrical with respect to the pupil.

17. A lithographic apparatus, comprising:

an illumination system that supplies a beam of radiation;

an array of individually controllable elements that pattern the beam; and a projection system that projects the patterned beam onto a target portion of a substrate, the projection system defining a pupil and comprising an array of lenses, wherein the individually controllable elements are arranged in groups, such that the patterned beam is directed by each element in each group towards a same lens in the lens array, and wherein the individually controllable elements in each group are controlled together to direct the patterned beam in different directions away from the pupil, such that a pattern imparted onto the beam by that group of individually controllable elements is substantially symmetrical with respect to the pupil.

* * * * *

UNITED STATES PATENT AND TRADEMARK OFFICE
CERTIFICATE OF CORRECTION

| | | |
|---|---|---|
| PATENT NO. | : 7,142,286 B2 | |
| APPLICATION NO. | : 10/899302 | |
| DATED | : November 28, 2006 | |
| INVENTOR(S) | : Pieter Willem Herman de Jager | |

It is certified that error appears in the above-identified patent and that said Letters Patent is hereby corrected as shown below:

<u>Title Page</u> Page 2, column 2

Item [56], References Cited, FOREIGN PATENT DOCUMENTS section please replace "WO98/3396" with --WO98/33096--.

Signed and Sealed this

Sixth Day of March, 2007

JON W. DUDAS
*Director of the United States Patent and Trademark Office*